United States Patent [19]

Sun

[11] Patent Number: 5,399,507
[45] Date of Patent: Mar. 21, 1995

[54] FABRICATION OF MIXED THIN-FILM AND BULK SEMICONDUCTOR SUBSTRATE FOR INTEGRATED CIRCUIT APPLICATIONS

[75] Inventor: Shih-Wei Sun, Austin, Tex.

[73] Assignee: Motorola, Inc., Schaumburg, Ill.

[21] Appl. No.: 265,860

[22] Filed: Jun. 27, 1994

[51] Int. Cl.[6] .................................... H01L 21/265
[52] U.S. Cl. ................................ 437/24; 437/26; 437/63; 148/DIG. 13
[58] Field of Search ................. 437/21, 24, 26, 63, 437/64, 54; 148/DIG. 13; 257/391, 393, 396

[56] References Cited

U.S. PATENT DOCUMENTS

| | | | |
|---|---|---|---|
| 4,523,213 | 6/1985 | Konaka et al. | 437/24 |
| 4,683,637 | 8/1987 | Varker et al. | 437/63 |
| 4,700,454 | 10/1987 | Baerg et al. | 437/24 |
| 4,810,664 | 3/1989 | Kamins et al. | 437/24 |
| 5,182,226 | 1/1993 | Jang | 437/26 |
| 5,185,535 | 2/1993 | Farb et al. | 437/21 |

*Primary Examiner*—Brian E. Hearn
*Assistant Examiner*—Chandra Chaudhari
*Attorney, Agent, or Firm*—Minh-Hien N. Clark

[57] ABSTRACT

A mixed thin-film and bulk semiconductor substrate (10, 30) for integrated circuit applications is made with two different processes. In the first process, a standard wafer (11) is masked around its periphery (14). The internal unmasked portion (16) is implanted with an insulating species to form a buried dielectric layer (18), thus forming a mixed thin-film and bulk semiconductor substrate. Alternatively, a thin-film wafer may be masked on an internal portion (36) and then etched to expose a portion (40) of the underlying bulk substrate (11') around the periphery of the wafer. An epitaxial layer (50) is then grown to build up the exposed bulk portion to form the mixed substrate. An isolation region (24, 52, 46, 54) is formed at a boundary between the thin-film portion and the bulk portion. Devices (27, 28, 28') having different voltage requirements may then be formed overlying appropriate portions of the mixed substrate.

13 Claims, 3 Drawing Sheets

FABRICATION OF MIXED THIN-FILM AND BULK SEMICONDUCTOR SUBSTRATE FOR INTEGRATED CIRCUIT APPLICATIONS

CROSS-REFERENCE TO RELATED APPLICATION

This application relates in part to material disclosed in U.S. patent application Ser. No. 08/205,477 by Shih-Wei Sun entitled "Protection Device for an Integrated Circuit and Method of Formation" filed on Mar. 4, 1994 and U.S. patent application Ser. No. 08/232,968 by Craig S. Lage entitled "Static-Random-Access Memory Cell and Process for Forming the Memory Cell" filed on Apr. 25, 1994, both assigned to assignee hereof.

FIELD OF THE INVENTION

This invention relates generally to integrated circuits, and more specifically to a mixed thin-film and bulk semiconductor substrate for integrated circuit applications and its method of formation.

BACKGROUND OF THE INVENTION

Integrated circuits typically have a protection device, which is placed between an input/output (I/O) pad and its corresponding internal circuitry. The protection device prevents the circuitry from being damaged when a high transient voltage is placed on the I/O pad, such as during an electrostatic discharge (ESD) event. Protection devices are particularly important in MOS integrated circuits, because the breakdown voltage of a typical MOS transistor with a 15 nanometer gate oxide is approximately 15 volts. Therefore, electrostatic discharges, which may create voltages in excess of 1000 volts at an I/O pad, will damage MOS transistors if they are left unprotected. The protection device, however, shields the internal MOS circuitry from these excessive voltages, and thus protects the integrated circuit. However, it has been thus far impossible to build thick-field ESD protection devices on thin-film silicon on insulator (SOI) wafers, because the field oxide (FOX) isolation consumes the entire SOI layer during FOX formation.

Additionally, heat dissipation of I/O buffer circuits, such as a high voltage MOSFET, has been reported as a major obstacle for thin-film SOI material due to the poor thermal conductivity of buried oxide. The buffer circuits are typically very large and hence generate a lot of heat. Thus, poor heat dissipation poses a critical concern in the SOI technology. Additionally, a thin-film SOI MOSFET suffers from a low bipolar-snapback voltage between the source and drain electrodes. These problems effectively limit the SOI applications to a circuit or device having a lower supply voltage ($V_{cc}$) than the standard 5 volts or 3.3 volts devices built on bulk silicon. With current SOI technology, a $V_{cc}$ greater than 2 volts will generate a runaway problem with the electron-hole pair generated in the channel region which causes the single-transistor latch. Thus, integration of 3.3 volts or 5 volts devices have been incompatible on thin-film SOI wafers because of the low breakdown voltage.

BRIEF DESCRIPTION OF THE DRAWINGS

The various figures illustrate many of the same, or substantially similar elements. Therefore, like or substantially similar elements will be labeled using the same reference numbers.

DETAILED DESCRIPTION OF THE PREFERRED EMBODIMENT

An embodiment of the invention discloses a method for making a mixed thin-film and bulk substrate for integrated circuit applications. A semiconductor substrate having an implant mask overlying a first portion of the semiconductor substrate is provided. Then a buried dielectric layer is formed underneath a top surface of the semiconductor substrate in a second unmasked portion of the semiconductor substrate. Thus a mixed thin-film and bulk semiconductor substrate is formed, where the bulk portion corresponds to the first portion of the substrate, and the thin-film portion corresponds to the second portion of the substrate. An isolation region is formed at a boundary between the buried dielectric layer in the second portion of the semiconductor substrate and the first portion of the semiconductor substrate. A first device may then be formed overlying the first portion of the mixed substrate, and a second device having a supply voltage less than 3.3 volts may be formed overlying the second portion of the substrate.

Another embodiment of the invention discloses a mixed thin-film and bulk substrate for integrated circuit applications. The mixed substrate has a bulk semiconductor substrate and a first thin-film semiconductor layer overlying a first portion of the bulk substrate. A buried dielectric layer underlies the first thin-film semiconductor layer and overlies the first portion of the bulk semiconductor substrate. A second semiconductor layer overlies a second portion of the bulk semiconductor substrate. A sidewall spacer is disposed at an edge of both the first thin-film semiconductor layer and the buried dielectric layer to separate the first thin-film semiconductor layer and the buried dielectric layer from the second semiconductor layer, wherein the sidewall spacer overlies a third portion of the bulk semiconductor substrate.

These and other features, and advantages, will be more clearly understood from the following detailed description taken in conjunction with the accompanying drawings. It is important to point out that the illustrations may not necessarily be drawn to scale, and that there may be other embodiments of the present invention which are not specifically illustrated.

Figure 1:
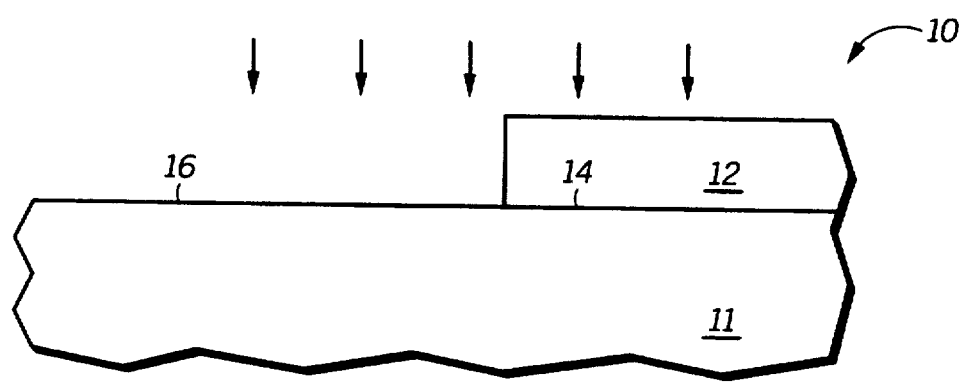
FIGS. 1-4 illustrate, in cross-section, process steps for forming a mixed thin-film and bulk semiconductor substrate in accordance with a first embodiment of the invention.

FIGS. 1-4 illustrate, in cross-section, process steps for forming a protection device in combination with thin-film technology in accordance with a first embodiment of the invention. In FIG. 1, a substrate 10 composed of a bulk semiconductor substrate 11 having a mask 12 overlying a first portion 14 of the bulk semiconductor substrate 11 is provided. Bulk semiconductor substrate 11 is typically, but not limited to, single crystal silicon. The mask 12 leaves a second portion 16 of the substrate 11 exposed. The substrate 10 undergoes an implanting process, wherein ions of an insulating species are implanted into the exposed portion 16 of the bulk substrate 11. Implanting is an established process in the art. Although oxygen ions are typically used in implanting, nitrogen ions or some other insulating species may also be used in the implant. The mask 12 is an implant mask, such as a photoresist or another hard mask, that prevents the covered portion 14 of the bulk semiconductor substrate 11 from being affected during the implanting process. After the implant process, the mask 12 is removed from the surface of the semiconductor substrate 11 using a conventional process, such as a photoresist ash.

Figure 2:
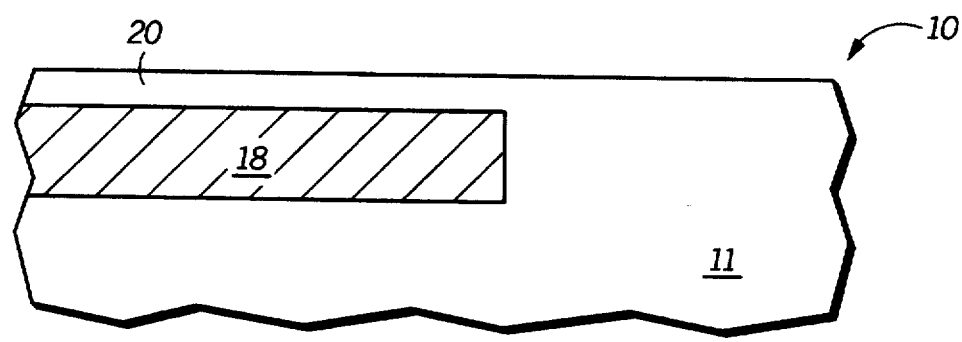

The implanting process results in the substrate 10 having a buried dielectric layer 18 as illustrated in FIG. 2. The thickness of the buried dielectric layer 18 is preferably in a range of 2000 to 5000 angstroms. If oxygen ions were implanted, then the buried dielectric layer 18 would be an oxide layer. The term SOI has been used to describe the resulting structure due of the thin-film 20 of silicon overlying the oxide layer 18, wherein this thin-film 20 has a thickness preferably in a range of 500 to 2000 angstroms. If nitrogen ions were implanted, then the resulting buried dielectric layer 18 would be characterized as a nitride layer which is also an insulator. As can be seen in FIG. 2, the resulting semiconductor substrate 10 is composed of both a bulk substrate portion 11 and a thin-film portion 20, an aspect which is critical to practicing the present invention.

Figure 3:
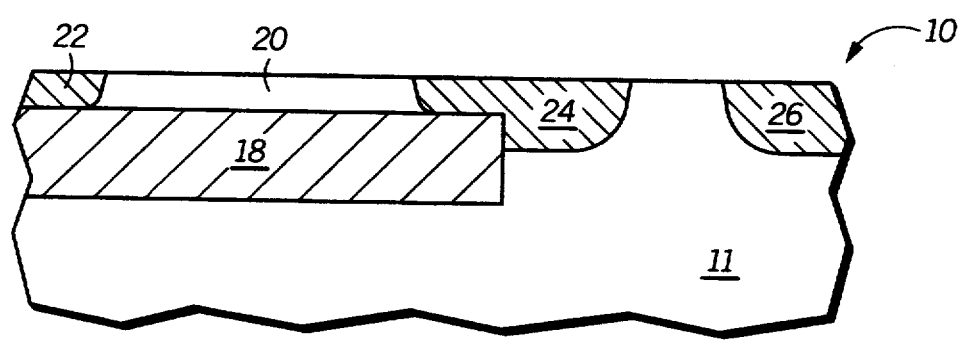

In FIG. 3, isolation regions 22, 24, and 26 are formed in the substrate 10. Isolation regions are typically field oxides (FOX), and methods for forming FOX are known in the art. Isolation region 22 is formed solely in the thin-film portion 20 of the substrate 10, while isolation region (thick-field region) 26 is formed solely in the bulk silicon portion of the substrate. Isolation region 24 is formed in the vertical boundary region between the buried dielectric layer 18 and the bulk semiconductor substrate 11. Thus, the isolation region 24 resembles that of a dual field oxide because half of the region is only as thick as the thin-film layer 20 while the other half of the region 24 is thicker occupying more of the bulk substrate.

Figure 4:
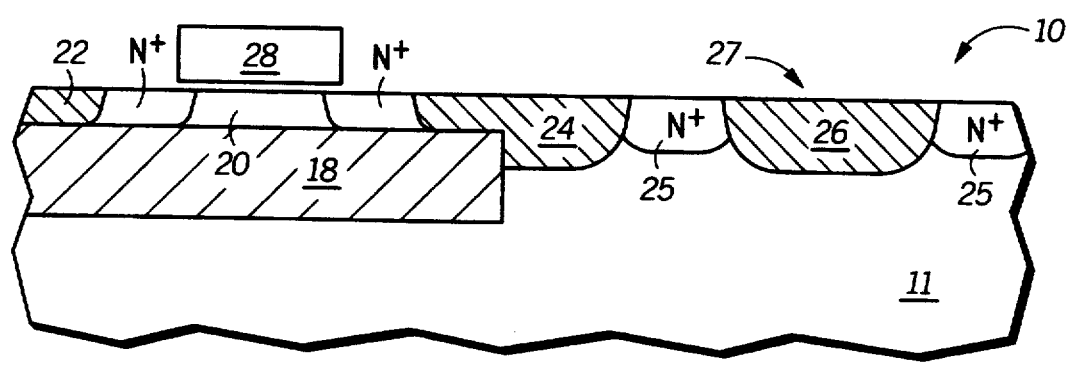

Once the substrate 10 is formed having both an SOI portion 20 and the bulk portion 11, a suitable protection device may be built on the substrate overlying the bulk portion 11 of the substrate. Additionally, a low voltage SOI circuit such as an internal MOSFET 28 may be built overlying the thin-film portion 20 as illustrated in FIG. 4. Although a MOSFET is illustrated in FIG. 4, it should be understood that any low $V_{cc}$ circuit may be constructed on the thin-film portion. Also illustrated in FIG. 4 is a punch through protection device 27 composed of the thick-field oxide region 26 and the source-/drain regions 25 which are formed simultaneously during the MOSFET fabrication wherein a dopant is implanted into the substrate to form the source/drain regions. The bulk portion 11 of the substrate 10 is not limited to a protection device for ESD. Any high $V_{cc}$ device may be constructed on the bulk side, such as a high voltage I/O buffer device.

Figure 5:
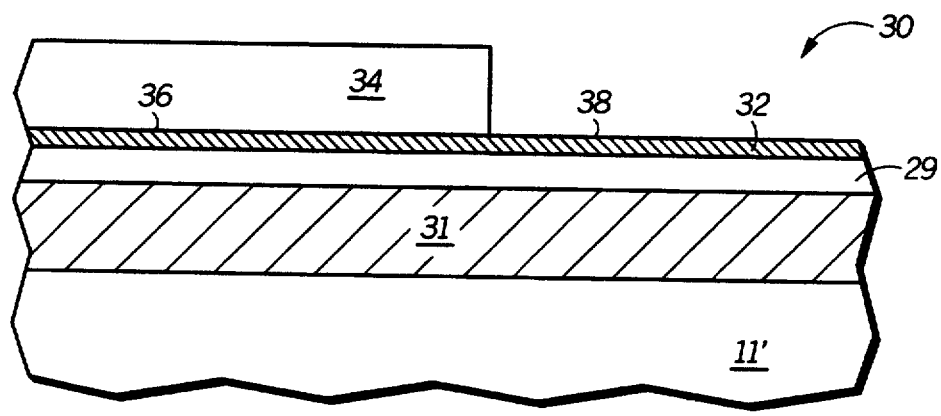
FIGS. 5-12 illustrate, in cross-section, process steps for forming a mixed thin-film and bulk semiconductor substrate in accordance with a second embodiment of the invention.

FIGS. 5-12 illustrate, in cross-section, process steps for forming a mixed thin-film and bulk semiconductor substrate using an initial thin-film substrate 30 in accordance with a second embodiment of the invention. In FIG. 5, thin-film substrate 30 is composed of a thin-film semiconductor layer 29, a buried dielectric layer 31 underlying the thin-film layer 29, and a bulk semiconductor substrate 11' underlying the dielectric layer 31. The bulk substrate 11' and thin-film layer 29 are both a semiconductor material, such as silicon, while the buried dielectric layer 31 can be either an oxide or a nitride or some other insulating material. A standard separation by implantation of oxygen (SIMOX) wafer or a bound and etch back SOI (BESOI) wafer may be used as the initial thin-film substrate 30. A dielectric layer 32 is formed overlying the top surface of the thin-film layer 29. Examples of possible materials to be used as dielectric layer 32 include, but are not limited to, silicon oxide, silicon nitride, boron nitride, and oxynitride. The purpose of the dielectric layer 32 is to protect the underlying thin-film layer 29 which will become more apparent in subsequent discussion. A mask 34 is formed overlying a first portion 36 of the substrate 30 leaving a second portion 38 of the substrate 30 exposed. The first portion 36 of the substrate 30 corresponds to the desired area where thin-film circuits will be subsequently constructed.

Figure 6:
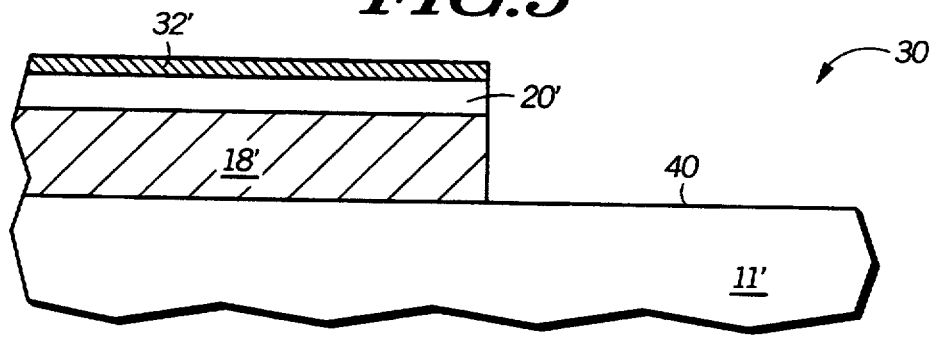

In FIG. 6, the exposed portion 38 of the substrate 30 is etched to remove a portion of the dielectric layer 32, the thin-film layer 29, and the buried dielectric layer 31 to expose a portion 40 of the underlying bulk substrate 11' and to leave a remaining portion 32' of the dielectric layer, a remaining portion 20' of the thin-film layer, and a remaining portion 18' of the buried dielectric layer. The etching should be controlled such that the etch stops at the top surface of the underlying bulk substrate 11' although a small amount of overetch may be tolerated.

Figure 7:
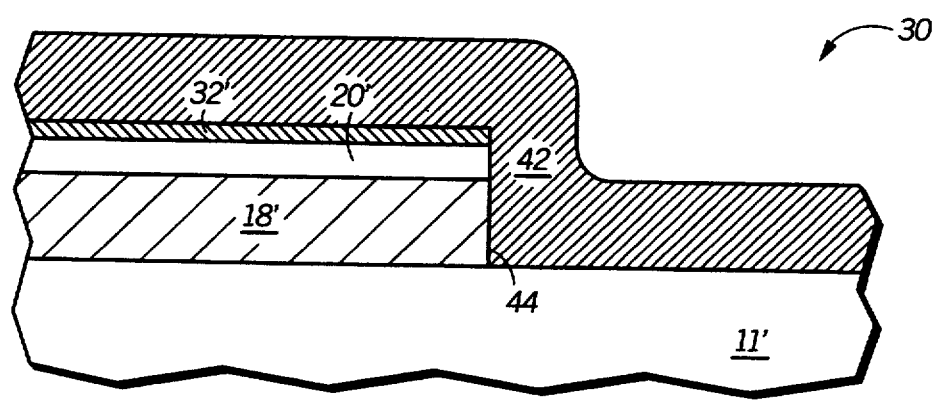
Figure 8:
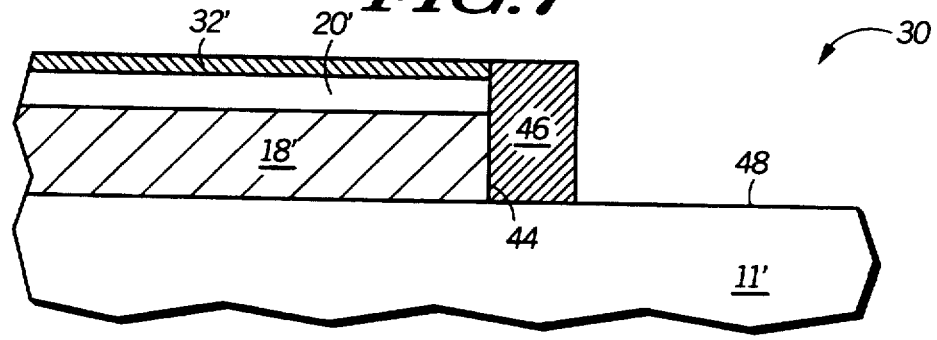

In a next step, as illustrated in FIG. 7, a second dielectric layer 42 is formed overlying the top surfaces of the substrate 30 to cover both the remaining portion 32' of the first dielectric layer as well as the exposed portion 40 of the bulk substrate 11'. The second dielectric layer 42 can be formed using conventional deposition techniques. The thickness of the second dielectric layer can in a range of 500 to 4000 angstroms with a preferable range of 1000 to 3000 angstroms. It is critical that the second dielectric layer 42 be sufficiently thick at the edge 44 of the remaining portions 32', 20', and 18' because the second dielectric 42 is used to form a sidewall spacer 46 as illustrated in FIG. 8. Examples of possible materials to be used as the second dielectric layer 42 include, but are not limited to, silicon oxide, silicon nitride, boron nitride, and oxynitride. It is critical that the material used for the second dielectric layer 42 differs from that of the first dielectric layer 32 because the dielectric layer 32 will act as an etch stop during subsequent removal of the second dielectric layer 42.

The second dielectric layer is removed using a reactive ion etch (RIE) process. Only a portion of the dielectric layer is retained to form the sidewall spacer 46 at the edge 44. The sidewall spacer is approximately 500 to 4000 angstroms, depending on the thickness of the second dielectric layer. By removing most of the second dielectric layer, another portion 48 of the bulk substrate 11' is exposed.

Figure 9:
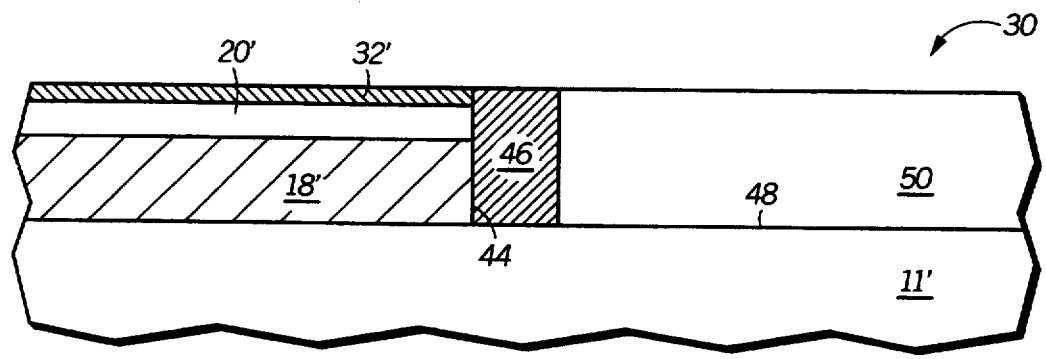

FIG. 9 illustrates the next step in the process, wherein an epitaxial layer 50 of semiconductor material is grown or deposited overlying the exposed portion 48 of the bulk substrate 11'. The crystal lattice structure of the underlying bulk semiconductor substrate 11' should be duplicated in the epitaxial layer so that in effect, the epitaxial layer is an extension of the bulk material. The first dielectric layer 32 also serves as a barrier in this epitaxial deposition process to prevent epitaxial silicon from being added to the thin-film layer 20'.

Figure 10:
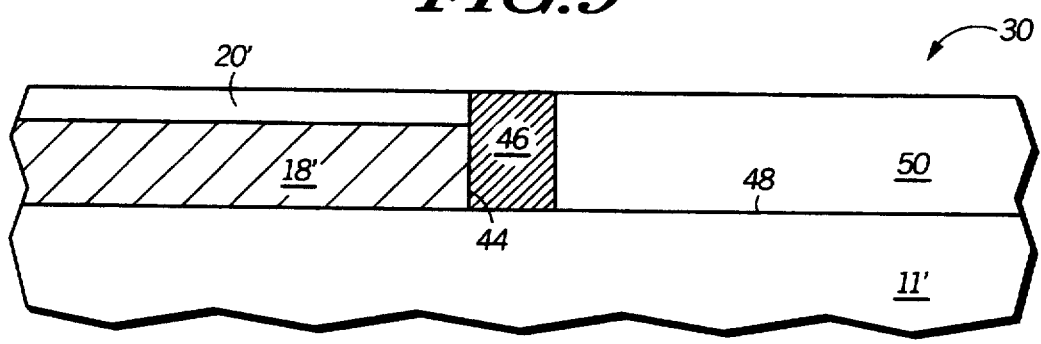

Once the epitaxial layer 50 is of sufficient thickness, approximately the same height as the spacer, then the remaining portion 32' of the dielectric layer is removed as illustrated in FIG. 10. The removal may be accomplished through an etching process. A planarizing process may be desirable to smooth the top surface of the substrate 30 after the dielectric portion 32' is removed. By practicing the foregoing steps, a mixed substrate having both a bulk portion and a thin-film portion can be manufactured, wherein the sidewall spacer 46 separates the two portions of the substrate.

Figure 11:
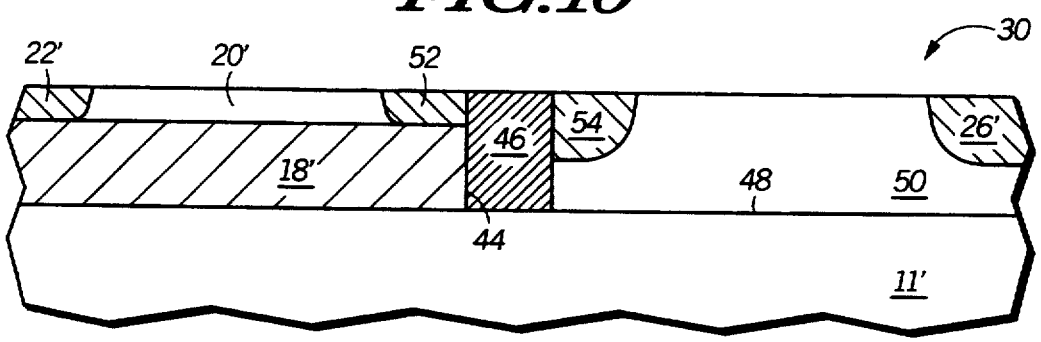

In FIG. 11, isolation regions 22', 26', 52, and 54 are formed in the substrate 30. Again, the isolation regions are typically field oxides. Isolation region 22' is formed solely within the thin-film portion 20', and isolation region 26' is formed solely within the epitaxy portion 50 of the substrate. Isolation regions 52 and 54, however, are formed around the sidewall spacer 46. Isolation region 52 is formed on the thin-film side of the spacer, while isolation region 54 is formed on the bulk material side of the spacer. Since the sidewall spacer 46 is a dielectric material and the isolation regions are field oxides, the resulting structure is an especially effective isolation structure at the boundary between the thin-film portion of the substrate and the bulk substrate.

Figure 12:
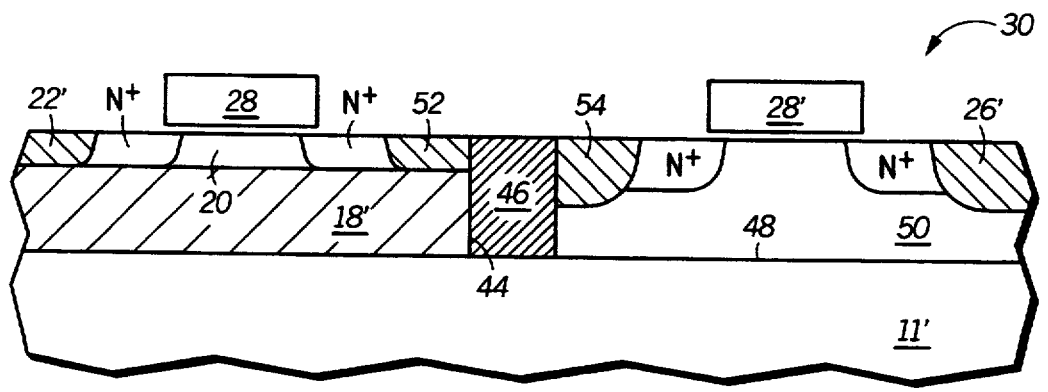

Illustrated in FIG. 12 is an anticipated use for the substrate made in accordance with the second embodiment of the invention. A low $V_{cc}$ internal MOSFET can be built on the thin-film portion. Another high $V_{cc}$ MOSFET, or any other high voltage device, can be built overlying the bulk portion. Alternatively, a thick-field ESD protection device may be built overlying the bulk portion. This embodiment of the invention offers the same advantage as the first embodiment of the invention in that a mixed substrate is made such that a combination of both thin-film SOI devices and thick-field ESD protection device may be constructed on the same substrate.

The foregoing description and illustrations contained herein demonstrate many of the advantages associated with the present invention. In particular, it has been revealed that a mixed thin-film and bulk semiconductor substrate can be manufactured to allow for both thin-film SOI devices and thick-field ESD protection device or a high voltage I/O buffer circuit to be placed on the same substrate. Moreover, by allowing I/O buffer circuits to be built on bulk silicon instead of an SOI substrate, the thermal dissipation of the heat generated by these I/O buffer circuits is improved because silicon is a good thermal conductor. Yet another advantage is that the present invention allows the integration of any 3.3 volts or 5 volts devices with thin-film SOI technology by providing a bulk semiconductor portion for these devices.

Thus it is apparent that there has been provided, in accordance with the invention, a mixed thin-film and bulk semiconductor substrate for integrated circuit applications and a methods of formation for this mixed substrate that fully meet the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, the present invention is not limited in any way to MOSFETs and ESD protection devices being built on the mixed thin-film and bulk substrate. Rather, any integrated circuit applications that have different breakdown voltages may be constructed on the appropriate portions of the mixed thin-film and bulk semiconductor substrate of the present invention. Therefore, it is intended that this invention encompass all such variations and modifications falling within the scope of the appended claims.

It is claimed:

1. A method for making a mixed thin-film and bulk substrate for integrated circuit applications, comprising the steps of:
    providing a semiconductor substrate having an implant mask overlying a first portion of the semiconductor substrate;
    forming a buried dielectric layer underneath a surface of a second portion of the semiconductor substrate;
    forming an isolation region at a boundary between the buried dielectric layer in the second portion of the semiconductor substrate and the first portion of the semiconductor substrate;
    forming a first device overlying the first portion of the semiconductor substrate; and
    forming a second device having a supply voltage less than 3.3 volts overlying the second portion of the semiconductor substrate.

2. The method of claim 1, wherein the step of providing the semiconductor substrate comprises providing a silicon substrate.

3. The method of claim 1, wherein the step of forming the buried dielectric layer comprises implanting an insulating species into the second portion of the semiconductor substrate, wherein the second portion is not covered by the implant mask.

4. The method of claim 3, wherein the step of implanting the insulating species is characterized as implanting a plurality of ions selected from a group consisting of: oxygen and nitrogen.

5. The method of claim 1, wherein the step of forming the first device comprises forming a device selected from a group consisting of: a thick-field protection device and an I/O buffer MOSFET.

6. The method of claim 1, wherein the step of forming the second device is further characterized as forming an internal thin-film SOI MOSFET.

7. A method for making a protection device for an integrated circuit, comprising the steps of:
    providing a substrate having a first thin-film semiconductor layer, a first buried dielectric layer underlying the first thin film semiconductor layer, and a second semiconductor layer underlying the first buried dielectric layer;
    removing a first portion of the first thin-film semiconductor layer and a first portion of the first buried dielectric layer to form an exposed portion of the second semiconductor layer and to leave a remaining portion of the first thin-film semiconductor layer and a remaining portion of the first buried dielectric layer;
    forming a second dielectric layer overlying the exposed portion of the second semiconductor layer and the remaining portions of the first thin-film semiconductor layer and the first buried dielectric layer;
    removing a portion of the second dielectric layer to form a sidewall spacer at an edge of the remaining portions of the first thin-film semiconductor layer and the first buried dielectric layer;
    growing a third semiconductor layer selectively over the exposed portion of the second semiconductor layer such that the sidewall spacer separates the remaining portions of the first thin-film semiconductor layer and the first buried dielectric layer from the third semiconductor layer;

forming an isolation region at the sidewall spacer; and forming a protection device overlying the third semiconductor layer, wherein the remaining portion of the first thin-film semiconductor layer may be used to form a low voltage semiconductor device.

8. The method of claim 7, wherein the step of providing the substrate comprises providing a thin-film SOI wafer.

9. The method of claim 7, wherein the step of providing the substrate is further characterized as providing a substrate having a buried oxide layer for the first buried dielectric layer.

10. The method of claim 7, wherein the step of removing a first portion of the first thin-film semiconductor layer is performed by a patterning and etching process.

11. The method of claim 7, wherein the step of growing a third semiconductor layer comprises depositing a selective epitaxy of silicon.

12. The method of claim 7, further comprising the step of planarizing a top surface of the substrate after the step of growing the third semiconductor layer.

13. The method of claim 7, wherein the step of forming the second dielectric layer is characterized as forming the second dielectric layer having a thickness substantially in a range of 500 to 4000 angstroms.

* * * * *